(12) United States Patent
Lasser et al.

(10) Patent No.: US 6,977,847 B2
(45) Date of Patent: Dec. 20, 2005

(54) DETECTING PARTIALLY ERASED UNITS IN FLASH DEVICES

(75) Inventors: Menahem Lasser, Kohav Yair (IL); Meir Avraham, Rishon Lezion (IL)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 365 days.

(21) Appl. No.: 10/298,094

(22) Filed: Nov. 18, 2002

(65) Prior Publication Data

US 2003/0099134 A1 May 29, 2003

Related U.S. Application Data

(60) Provisional application No. 60/332,056, filed on Nov. 23, 2001.

(51) Int. Cl.⁷ .............................................. G11C 16/04
(52) U.S. Cl. .............................. 365/185.33; 365/185.29
(58) Field of Search ....................... 365/185.29, 185.33, 365/185.11, 218

(56) References Cited

U.S. PATENT DOCUMENTS

| | | | |
|---|---|---|---|
| 5,404,485 A | | 4/1995 | Ban |
| 5,799,168 A | | 8/1998 | Ban |
| 5,860,082 A | * | 1/1999 | Smith et al. ................. 711/103 |
| 5,937,425 A | | 8/1999 | Ban |
| 6,076,137 A | * | 6/2000 | Asnaashari ............ 365/185.33 |
| 6,125,435 A | * | 9/2000 | Estakhri et al. ............. 711/201 |
| 6,230,234 B1 | * | 5/2001 | Estakhri et al. ............. 711/103 |

FOREIGN PATENT DOCUMENTS

WO    WO 01/22205    3/2001    ............. G06F/1/30

* cited by examiner

*Primary Examiner*—Thong Q. Le
(74) *Attorney, Agent, or Firm*—Mark M. Friedman

(57) ABSTRACT

A method of managing the erasure of units of a flash memory. An indication is provided that an erasure of one or more units is pending, either before the units are erased or, in case of power loss, during the erasure. Subsequent to a completed erasure, an indication provided before an erasure is either erased or offset by an indication of a completed erasure. Upon powering up, or, in some embodiments, also prior to writing, the indications are inspected and units not completely erased are erased again. The present invention may be implemented in hardware, in firmware, in software, or in any combination of the three. In embodiments not totally reliant on software, appropriate non-volatile registers are provided, for storing the indications as erase pending flags and erase completed flags, and also for storing corresponding unit numbers.

82 Claims, 12 Drawing Sheets

DETECTING PARTIALLY ERASED UNITS IN FLASH DEVICES

This is a continuation-in-part of U.S. Provisional Patent Application No. 60/332,056, filed Nov. 23, 2001

FIELD AND BACKGROUND OF THE INVENTION

The present invention relates to flash memories and more particularly, to flash memories that are robust against partial erasure in the event of power loss.

Flash memory management systems (such as those disclosed in U.S. Pat. Nos. 5,404,485 and 5,937,425, both of which are incorporated by reference for all purposes as if fully set forth herein) must keep their integrity even after unexpected power loss which might occur at any point in time. The difficulty with achieving this is that such a power loss might occur in the middle of any operation performed by the flash device or in the middle of one of the software routines that manage the data structures essential for maintaining the coherent interpretation of the flash data contents.

One of the most important cases which must be considered in this respect is a power loss occurring while the flash device is carrying out an erase operation. Flash devices are memory devices in which data cannot be written unless the address to write into is in an "erased" state. Additionally, erasing cannot typically be done for individual addresses, but must be done for groups of a relatively large size of addresses (typical values are from a few kilobytes to a few hundred kilobytes). The chunk of flash media that is erased in one operation is called herein a "unit". It should be noted that the size of a unit may be a feature of the flash device hardware (being the smallest chunk of media addressed in an erase command to the hardware), or a feature of the flash management software which may combine a few hardware-based units into one larger logical unit always to be handled and erased as a single entity.

Such an erase operation is quite a long process (between a few milliseconds and a few seconds, depending on the flash type), and therefore the possibility of the power loss hitting while an erase operation is in progress cannot be ignored. The danger in having such interrupted erase operation is that when the flash device loses its power sources, it might be in a state in which it is partially erased—some of the bits in the erased unit might have already been brought to their target erased state, while others might still be in a non-erased state. Unless such a condition is detected and taken care of properly, the unit might be considered fully erased next time it is needed for use, but the next programming operation will not produce the desired results. Moreover, because of the way some flash devices perform their internal programming verification, such an effect of programming errors is not detected by the verification mechanism. This is so because the programming verification usually (in NAND flash) only detects failures in bringing an erased bit to a non-erased state, but the above effect results in a bit being at an non-erased state instead of in an erased state, which goes unnoticed.

Additionally, even if all bits in the erased unit currently read as erased (that is—the unit looks fully erased), the power loss might have caused the erasure to be marginal and less reliable, so that in the long run the data in this unit will have degraded retention capability resulting in accumulated errors. Therefore it is highly preferable not to rely on a unit whose erasure was interrupted by a power loss, but instead to erase the unit again before actually using it. Note that this last reason explains why even the trivial (but highly inefficient) method, of always reading the full unit contents before using the unit for verifying that the unit is fully erased, is not a good enough solution.

The above problem is well known in the prior art and there are software solutions to it. One simple and common solution is to use an "erase mark" for detecting the interrupted erasure case. According to this solution, after performing any erase command, the software always writes a special signature (the "erase mark") into a pre-defined location in the erased unit. Also, before performing any erase operation the erase mark of the unit is overwritten to destroy the erase mark. Additionally, whenever a free unit is allocated for use, the first step is to check for the existence of the unit's erase mark. If the unit completed erasing normally, then the erase mark is there. But if the last erase operation on this unit was interrupted by a power loss, no erase mark exists. Therefore the software can determine whether the newly allocated unit was reliably erased, and if not—erase it again. This solution is in use for quite a few years, for example in the TrueFFS family of flash disk drivers offered by M-Systems Flash Disk Pioneers Ltd. of Kfar Saba, Israel.

This solution requires the flash management system to make more than one write operation into some of the flash pages before having to erase them for further writing (as understood herein, a flash page is the smallest chunk of data that can be written in one operation into the physical media, with one or more pages in a unit). This is so because the erase mark is first written, and then at a later stage user data is written into that same page. Additional write operations might occur for destroying the erase mark, and for other steps taken by the flash management system for supporting its control algorithms.

Most flash memory devices in use today support such a capability of multiple writing (known in the technical flash literature as Partial Page Programming or PPP for short). Typical PPP values currently range from 3 to 10. Recently, however, a few major flash memory device vendors announced that some of their forthcoming flash memory devices will no longer support PPP capability greater than one, which means it will not be allowed to write twice to the same page without first erasing it. This restriction makes the prior art methods for detecting potentially partially-erased flash units unusable.

There is thus a widely recognized need for, and it would be highly advantageous to have a method of detecting incomplete erasure of a PPP=1 flash memory.

SUMMARY OF THE INVENTION

According to the present invention there is provided a method of managing a flash memory that includes a plurality of units, each unit including a plurality of addressable locations, the method including the steps of: (a) providing each unit with a respective flag register separate from the addressable locations of the each unit; (b) prior to erasing at least one of the units., setting a respective erase pending flag in the respective flag register of each at least one unit that is to be erased; and (c) erasing the at least one unit.

According to the present invention there is provided a method of managing a flash memory that includes a plurality of units, each unit having a respective unit number, each unit including a plurality of addressable locations, the method including the steps of: (a) providing at least one flag register separate from the addressable locations of the units; (b) providing, for each at least one flag register, a corresponding unit number register separate from the addressable locations of the units; (c) prior to erasing at least one of the units: for each at least one unit that is to be erased: (i) setting a respective erase pending flag in one of the at least one flag register, and (ii) storing the respective unit number of the each unit in the unit number register that corresponds to the one flag register; and (d) erasing the at least one unit.

According to the present invention there is provided a method of managing a flash memory that includes a plurality of units, each unit having a respective unit number, each unit including at least one page, each page including a plurality of addressable locations, the method including the steps of (a) allocating at least one erase pending location in the flash memory (b) for each at least one erase pending location, allocating a corresponding erase completed location in the flash memory separate from the each at least one erase pending location, (c) prior to erasing at least one of the units, for each at least one unit that is to be erased, setting an erase pending flag in a corresponding one of the at least one erase pending locations; (d) erasing the at least one unit; and (e) for each at least one unit, subsequent to the erasing of the each unit setting an erase completed flag in a corresponding one of the at least one erase completed location.

According to the present invention there is provided a method of managing a flash memory that includes a plurality of units, each unit having a respective unit number, each unit including a plurality of addressable locations, the method including the steps of: (a) allocating at least one erase pending location in the flash memory; (b) for each at least one erase pending location, allocating a corresponding unit number storage location in the flash memory separate from the each at least one erase pending location; (c) prior to erasing at least one of the units, for each at least one unit that is to be erased: (i) setting an erase pending flag in a corresponding one of the at least one erase pending location, and (ii) storing the unit number of the each unit in the unit number storage location that corresponds to the corresponding one erase pending location; and (d) erasing the at least one unit.

According to the present invention there is provided a method of managing a flash memory that includes a plurality of units each unit including a plurality of addressable locations, the method including the steps of: (a) providing at least one nag register separate from the addressable locations of the units; (b) prior to erasing at least one of the units, setting a respective erase pending flag, in one of the at least one flag register; and (c) erasing the at least one unit.

According to the present invention there is provided a method of managing a flash memory that includes a plurality of units, each unit having a respective unit number, each unit including a plurality of addressable locations, the flash memory being operative to erase at most a certain maximum number of the units substantially concurrently, the method including the steps of: (a) providing flag registers equal in number to the maximum number of units; (b) for each flag register, providing a corresponding unit number register; (c) erasing at least one of the units; (d) detecting a power loss by the flash memory; and (e) if the power loss is synchronous with the erasing; for each at least one unit that is being erased: (i) setting a respective erase pending flag in a corresponding flag register, and (ii) storing the respective unit number of the each unit in the unit number register that corresponds to the corresponding flag register.

According to the present invention there is provided a flash memory device including: (a) a plurality of units, each unit including a plurality of addressable locations; and (b) for each unit, a respective flag register, separate from the addressable locations of the each unit, for indicating that the each unit is designated to be erased.

According to the present invention there is provided a flash memory device including: (a) a plurality of units, each unit having a respective unit number, each unit including a plurality of addressable locations; (b) at least one flag register, separate from the addressable locations, for storing an erase pending flag that indicates that one of the units is designated to be erased; and (c) for each at least one flag register, a corresponding unit number register, separate from the addressable locations, for storing the unit number of the one unit.

According to the present invention there is provided a flash memory device including: (a) a plurality of units, each unit having a respective unit number, each unit including a plurality of addressable locations; (b) a detecting mechanism for detecting a power loss; and (c) a recording mechanism for recording the unit numbers of the units that are being erased when the detecting mechanism detects the power loss.

In a first embodiment of the present invention, each unit of a flash memory is provided with a respective non-volatile flag register, separate from the addressable locations of the flash memory. Setting an erase pending flag in a unit's flag register indicates that that unit is scheduled to be erased. After a unit is successfully erased, an indication is provided that the unit has been erased, preferably by clearing the unit's erase pending flag.

Subsequent writing to the unit is conditional on the unites erase pending flag having been cleared. Specifically, before a unit is written to, the unit's erase pending flag is checked to make sure that it is cleared. If the unit's erase pending flag is cleared, the unit is written to. If the unit's erase pending flag is set rather than cleared, then the unit is erased, the unit's erase pending flag is cleared, and only then does writing to the unit commence.

Setting and clearing the erase pending flags, as well as checking that the erase pending flag of a unit that is to be written to is cleared, may be effected by hardware, by firmware or by software. If the erase pending flag of a unit that is to be written to is set rather than cleared, then the subsequent erasing, of that unit may be effected by hardware, by firmware, or by steps including issuing a software command.

In a second embodiment of the present invention, a set of nonvolatile flag registers, separate from the addressable locations of the flash memory, are provided. The number of flag registers provided is at least one, and typically is the maximum number of units that can be erased at one time. Along with the flag registers are provided corresponding non-volatile unit number registers, also separate from the addressable locations of the flash memory. Before erasing a unit, the unit's unit number is stored in one of the unit number registers, and an erase pending flag is set in the corresponding flag register. After the units, that have been designated to be erased, have been erased successfully, indications are provided that the units have been erased, preferably by clearing the erase pending flags. Setting, storing and clearing the erase pending flags may be effected by hardware by firmware or by software.

Subsequently, when the flash memory is powered up, if one of the erase pending flags still is set, the corresponding unit is erased. Note that "powering up" a flash memory is considered herein to span the entire time from when power is provided to the flash memory until the flash memory first is accessed for reading and/or writing. Erasing a unit whose erase pending flag is still set at power-up may be effected by hardware, by firmware or by software.

In a third embodiment of the present invention, addressable locations, in units other than the units that are to be erased, are used as erase pending registers. Also provided, or each unit that is to be erased, are two other addressable locations; one for storing the unit number of the unit and the other for storing an erase completed flag. Preferably, the addressable location of an erase pending flag and the addressable location of the corresponding erase completed flag are in different pages. Before erasing a unit, that unit's unit number is stored in one of the addressable locations that have been provided for that purpose, and an erase pending flag is set in the corresponding erase pending register. Optionally, the corresponding erase completed flag is cleared. After the units, that have been designated to be erased, have been erased successfully, corresponding erase completed flags are set in the corresponding addressable locations.

Subsequently, when the flash memory is powered up, if one of the set erase pending flags lacks a corresponding set erase completed flag (i.e., the corresponding erase completed flag is cleared), the corresponding unit is erased. As in the case of the second embodiment, "powering up" a flash memory is considered herein to span the entire time from when power is provided to the flash memory until the flash memory first is accessed for reading and/or writing.

In a fourth embodiment of the present invention, an indication, that one or more units are being erased, is provided during erasure upon detecting a power loss. The flash memory is provided with as many non-volatile flag, registers and corresponding non-volatile unit number registers as the maximum number of units that can be erased at one time. Preferably, these registers are separate from the addressable locations. The flash memory also is provided with a mechanism for detecting the power loss. When a power loss is detected, then for each unit being erased, the unit's unit number is stored in one of the unit number registers and a corresponding erase pending flag is set in a corresponding flag register. Setting the erase pending flags and storing the unit numbers may be effected by hardware or by firmware.

Subsequently, when the flash memory is powered up, every unit, whose unit number is stored in a unit number register that has a corresponding, set erase pending flag, is erased. As in the case of the second and third embodiments, "powering up" a flash memory is considered herein to span the entire time from when power is provided to the flash memory until the flash memory first is accessed for reading and/or writing. Erasure during power-up may be effected by hardware, by firmware, or upon the issuance of a software command. If no units are being erased when a power loss is detected, then all the erase pending flags are cleared.

A flash memory device of the present invention is a conventional flash memory device modified to include mechanisms for effecting the method steps of the present invention. In the case of the first, second and fourth embodiments, these method steps may be implemented in hardware, in firmware, or in any combination of the two. In the case of the first and second embodiments, the mechanisms alternatively enable the method steps to be performed by the firmware or the software of an external device. In the case of the fourth embodiment, the mechanisms alternatively enable the method steps associated with power-up to be performed by software. The third embodiment is implemented in software.

The fourth embodiment of a flash memory device of the present invention includes a detecting mechanism for detecting the power loss and a recording mechanism for recording which units were being erased at the time of the power loss. Preferably, the recording mechanism includes two sets of non-volatile registers; unit number registers for storing the unit numbers of the units that were being erased when power was lost, and corresponding flag registers for storing corresponding erase pending flags. Preferably, these registers are separate from the units' addressable locations.

The "flag registers" of the present invention usually are one bit long. For example, "setting" a flag could be setting the bit of the corresponding, register to binary "1" and clearing a flag could be setting the bit of the corresponding register to binary "0". Nevertheless, the scope of the present invention includes all equivalent implementations of the flag registers, including multi-bit implementations.

Although the motivation of the present invention is the advent of PPP=1 flash memories, the scope of the present invention includes both memories With PPP=1 and memories with PPP>1.

BRIEF DESCRIPTION OF THE DRAWINGS

The invention is herein described, by way of example only, With reference to the accompanying drawings, wherein.

DESCRIPTION OF THE PREFERRED EMBODIMENTS

The present invention is of a method for managing a flash memory device to ensure that flash memory units that are supposed to have been erased really have been erased. Specifically, the present invention can be used to ensure that the nominally erased units of a flash memory that has a PPP value of 1 really have been erased.

The principles and operation of a flash memory device according to the present invention may be better understood with reference to the drawings and the accompanying description.

Figure 1:
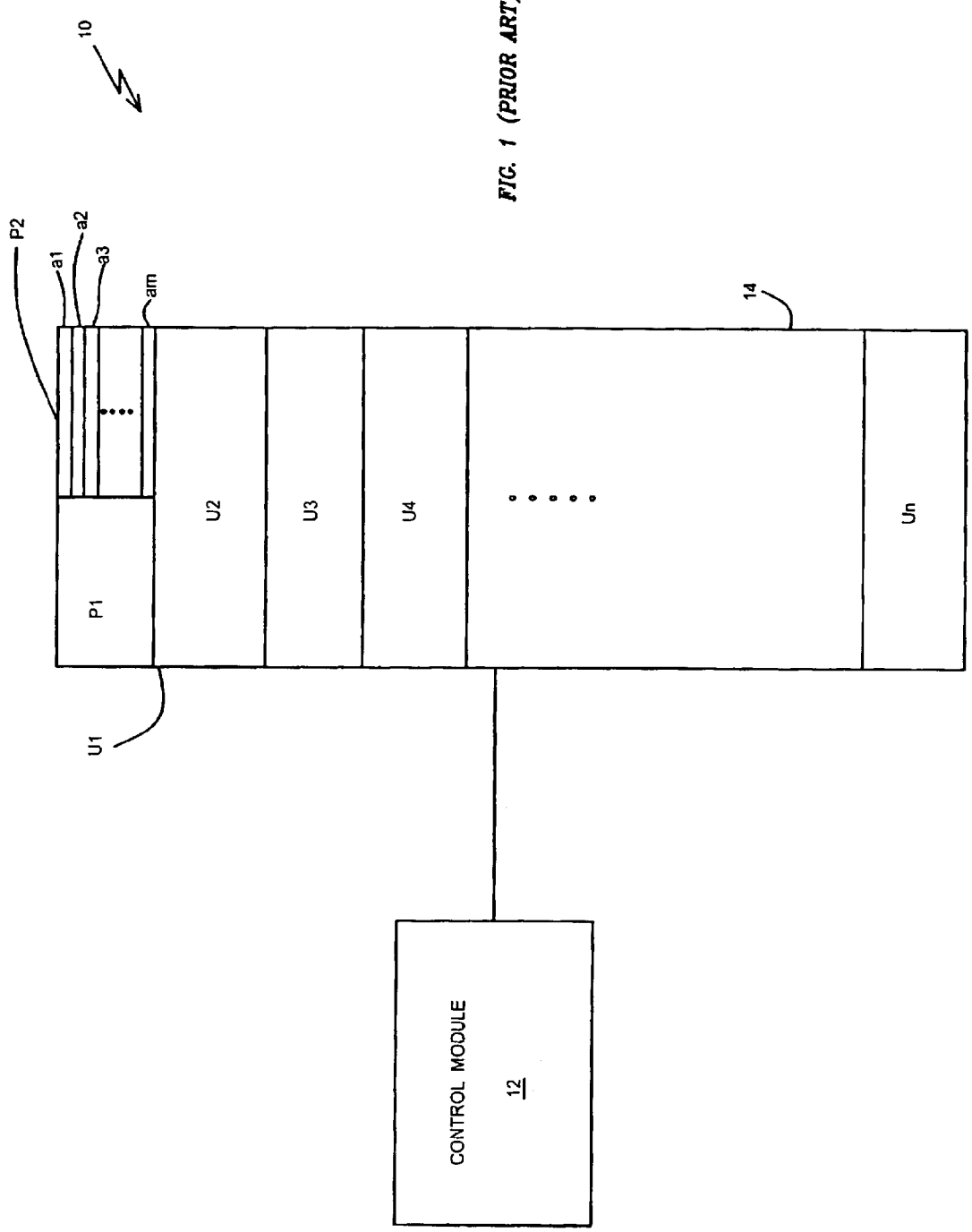
FIG. 1 illustrates a prior art flash memory device.

Referring now to the drawings, FIG. 1 illustrates a flash memory device 10 of the prior art. Device 10 includes a flash memory 14 that is controlled by a control module 12. Flash memory 14 includes n>1 units ul through un. As noted above, each unit of a flash memory includes one or more pages: in the case of device 10, each unit includes two pages. The two pages of unit ul are shown in FIG. 1 as pages p1 and p2. Also as noted above, each page of a flash memory includes a plurality of addressable locations. In FIG. 1, page p2 is shown including m addressable locations a1 through am. Control module 12 erases selected units u of flash memory 14, writes to selected pages p of flash memory 14, and reads the contents of selected addressable locations a of flash memory 14, all under the control of a host device (not shown).

Control module 12 is a generic control module that represents, schematically, all the methods used in the prior art for controlling flash memory 14. Typically, device 10 is fabricated with a sequencer for setting an operation, such as a read, write or erase operation, to be performed by flash memory 14, along with the address of the portion of flash memory 14 to which the operation applies. The sequencer also verifies and indicates the success of write and erase operations. Usually, device 10 is also provided with a controller for managing, at a higher level than is done by the sequencer, the operations performed by flash memory 14, for example for the purpose of checking for errors in data reads using error detection codes. Both flash memory 14 and the sequencer are fabricated on the same die. The controller may be fabricated on the same die as flash memory 14 and the sequencer, or on a separate die. In addition, because the controller is not programmable by the user, the controller may be configured to allow the host device to issue commands directly to the sequencer. Alternatively, if device 10 is configured without a controller, the host device issues to the sequencer all the commands that otherwise would be issued by the controller. Implementations of the present invention that require modifications only to flash memory 14 and to the sequencer are considered herein to be "hardware" implementations. Implementations of the present invention that require modifications to the controller, with or without modifications to flash memory 14 or to the sequencer, are considered herein to be "firmware" implementations. Implementations of the present invention that require modifications only to the software executed by the host device are considered herein to be "software" implementations. Similarly, activities that are initiated autonomously by the sequencer are considered herein to be effected by hardware; activities that are initiated by the controller are considered herein to be effected by firmware; and activities that are initiated by the host device under software control are considered herein to be effected by software. Consequently, the term "control module", as used herein, refers to either the sequencer, the controller or the host device software module that issues commands to the sequencer or to the controller.

Figure 2:
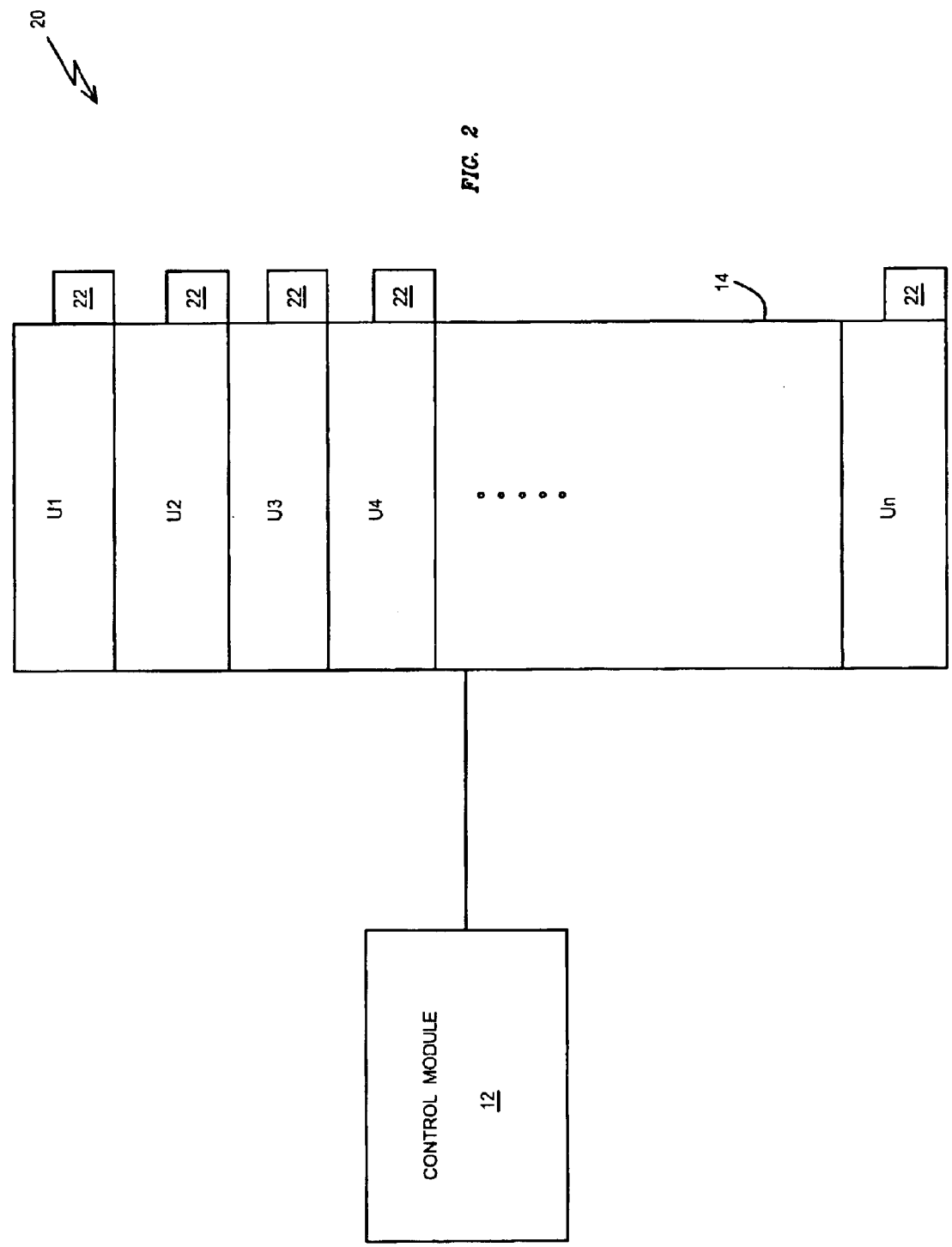
FIG. 2 illustrates a flash memory device of a first embodiment of the present invention.

FIG. 2 shows a flash memory device 20 according to a first embodiment of the present invention. Flash memory device 20 is identical to flash memory device 10, with the addition of non-volatile flag registers 22, one flag register 22 per unit u. Flag registers 22 are separate from addressable locations a. Nevertheless, flag registers 22 preferably are physically similar to addressable locations a, and typically differ from addressable locations a only by having their own unique access mechanisms, for example via special addresses or special device modes. An example of an implementation of flag registers 22 as addressable locations with special addresses is a flash memory device 20 in which the address space accessible to "normal" software commands does not include the addresses of flag registers 22, but in which the address space accessible to "special" software commands includes the addresses of flag registers 22. Each flag register 22 stores a one-bit-long "erase pending flag".

Figure 3:
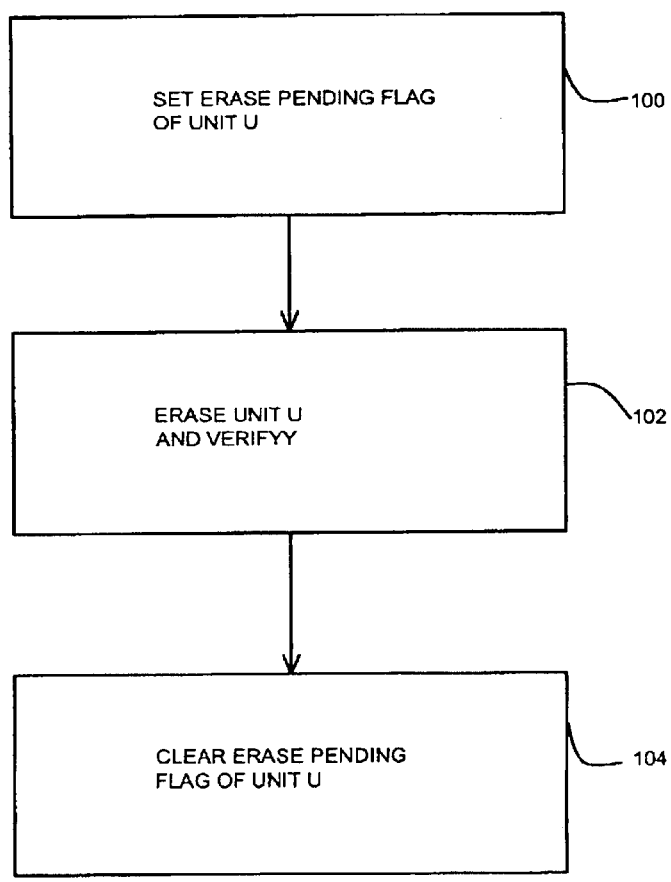
FIG. 3 is a flow chart of an erase operation of the flash memory device of FIG. 2.

Refer flow to FIG. 3, which is a flow chart of an erase operation of flash memory device 20. Normally, all the "erase pending flags" are cleared, i.e. equal to binary "0". Before control module 12 erases a particular unit u, control module 12 sets the corresponding erase pending flag by storing a binary "1" in flat, register 22 of that unit u (block 100). After that unit u has been erased and the erasure has been verified (block 102), control module 12 clears the corresponding erase pending flag by storing a binary "0" in flag register 22 of that unit u (block 104).

Figure 4:
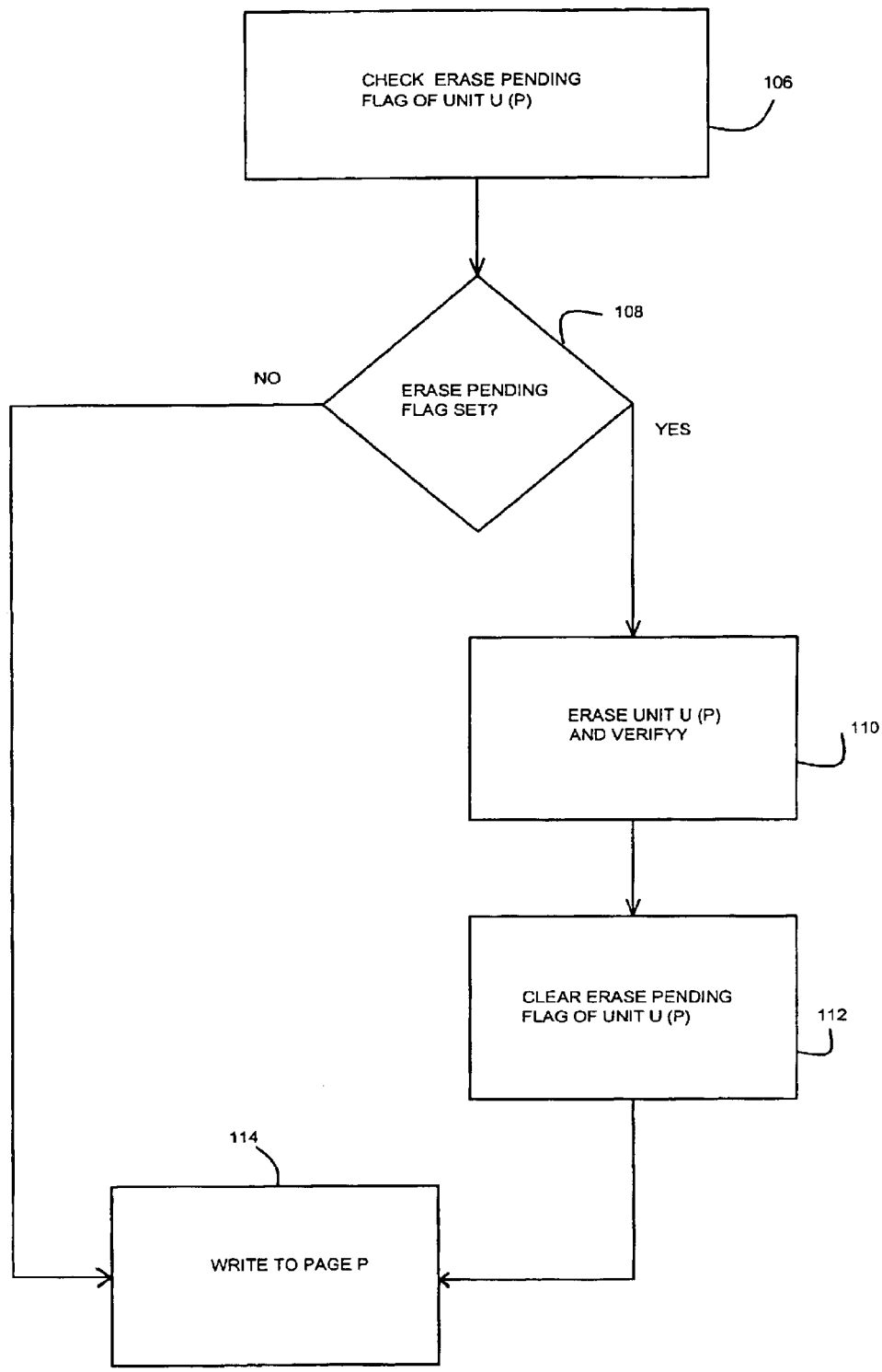
FIG. 4 is a flow chart of a write operation of the flash memory; device of FIG. 2.

Refer now to FIG. 4, which is a flow chart of a write operation of flash memory, device 20. Typically, the Petite operation is executed in the manner illustrated only the first time a page of a unit is written to subsequent to the allocation of the unit from a pool of free units that are available for writing: but any write operation may be executed in the manner illustrated. Before control module 12 writes to a page p, control module 12 checks the erase pending flag in flag register 22 of unit u that includes that page p (block 106). If that erase pending flag is cleared (block 108), writing proceeds normally (block 114). If that erase pending flag is set (block 108), indicating that the most recent erasure of that unit u was interrupted by a loss of power, control module 12 erases that unit u and verifies the erasure (block 110). Control module 12 then clears the erase pending flag (block 112). Only then does control module 12 write to that page p (block 114).

This method, of protecting a flash memory device against incomplete erasures in the event of a loss of power, is applicable both to flash memory devices that erase one unit u at a time and to flash memory devices that can erase several units u at a time. Setting, clearing and checking the erase pending flags may be done by the flash device hardware, by the flash controller firmware, by the flash management software, or by a combination of the three.

Figure 5:
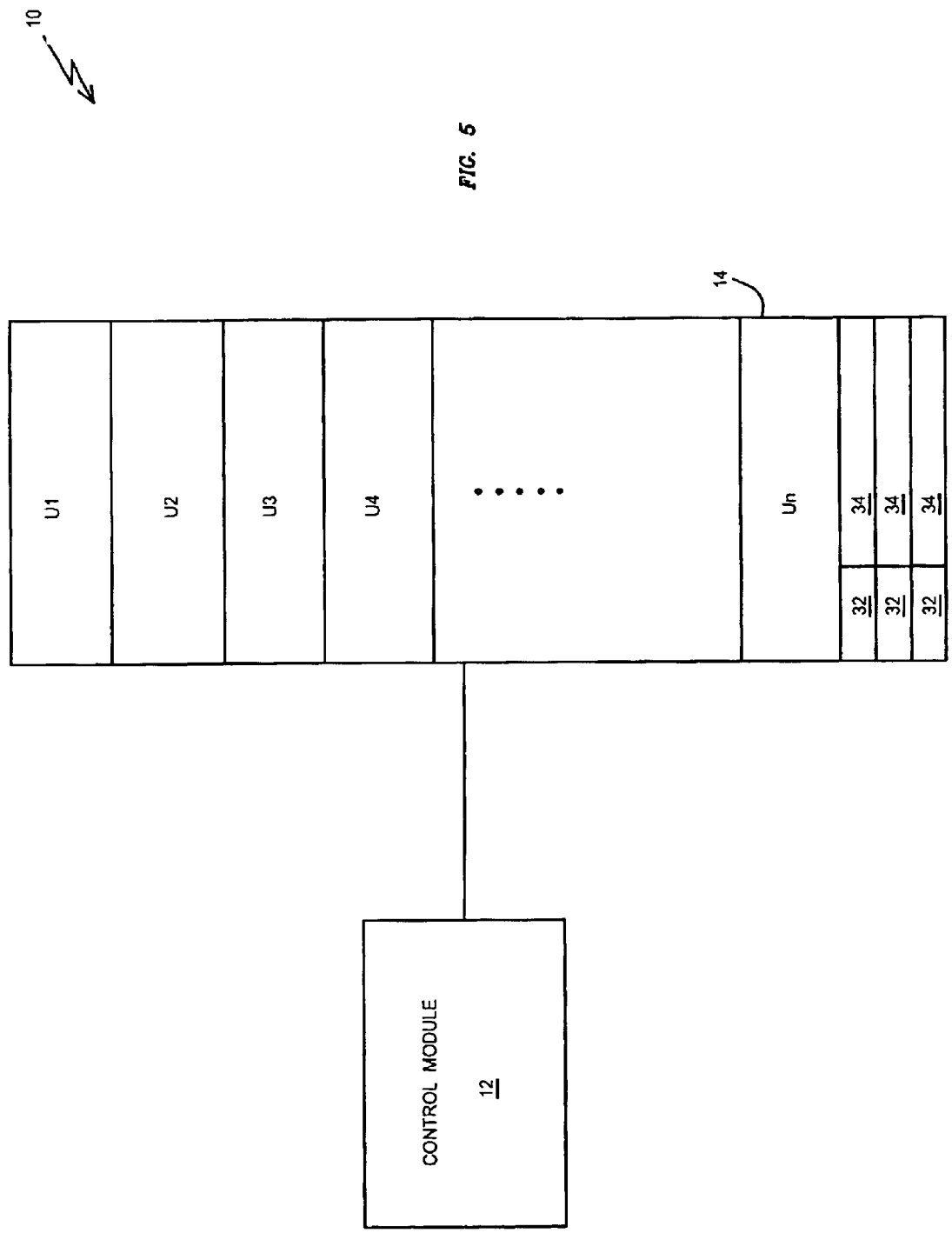
FIG. 5 illustrates a flash memory device of a second embodiment of the present invention.

FIG. 5 shows a flash memory device 30 according to a second embodiment of the present invention. Flash memory device 30 is identical to flash memory device 10, with the addition of several non-volatile flag registers 32 and several corresponding non-volatile unit number registers 34. Flag registers 32 and unit number registers 34 are separate from addressable locations a. Flag registers 32 and unit number registers 34 are equal in number to the maximum number of units u that flash device 30 can erase concurrently. In the particular embodiment illustrated in FIG. 5, flash device 30 can erase up to three units u concurrently, so flash memory device 30 includes three flag registers 32 and three unit number registers 34. Each flag register 32 stores a one-bit-long erase pending flag. Each unit number register 34 is sufficiently long to store any valid unit number. Each flag register 32 is associated with a specific respective unit number register 34.

Figure 6:
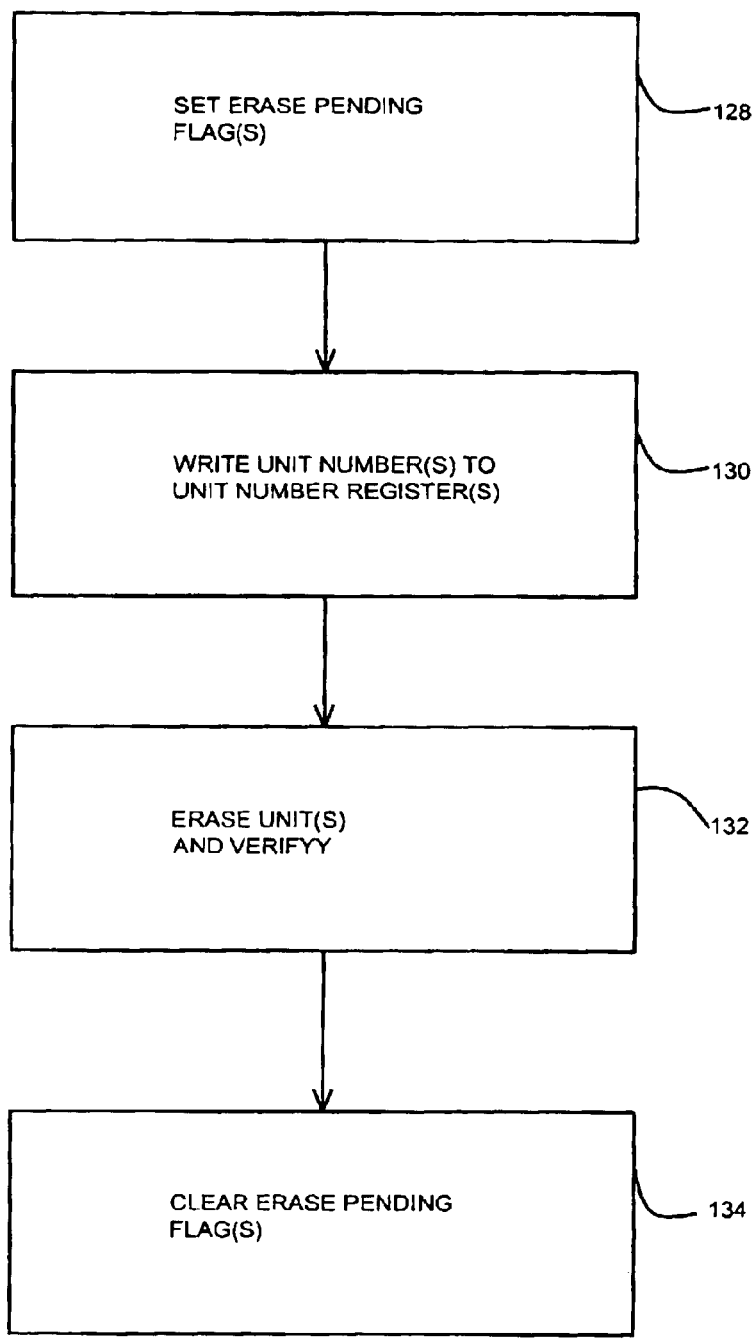
FIG. 6 is a flow chart of an erase operation of the flash memory device of FIG. 5.

Refer now to FIG. 6, which is a flow chart of an erase operation of flash memory device 30. Normally, all the erase pending flags are cleared, i.e., equal to binary "0". As noted above, control module 12 is operative to erase one, two or three units u at the same time. Before control module 12 erases a group of from one to three units u, control module 12 sets the same number of erase pending flags by storing a binary "1" in each of the same number of flag registers 32 (block 128). Control module 12 also writes, to the unit number registers 34 associated with those flag registers 32, the unit number or unit numbers of the unit or units u that are to be erased (block 130). After the unit or units u have been erased and the erasures have been verified (block 132), control module 12 clears the corresponding erase pending flags by storing binary "0"s in the corresponding flag registers 32 (block 134).

Figure 7:
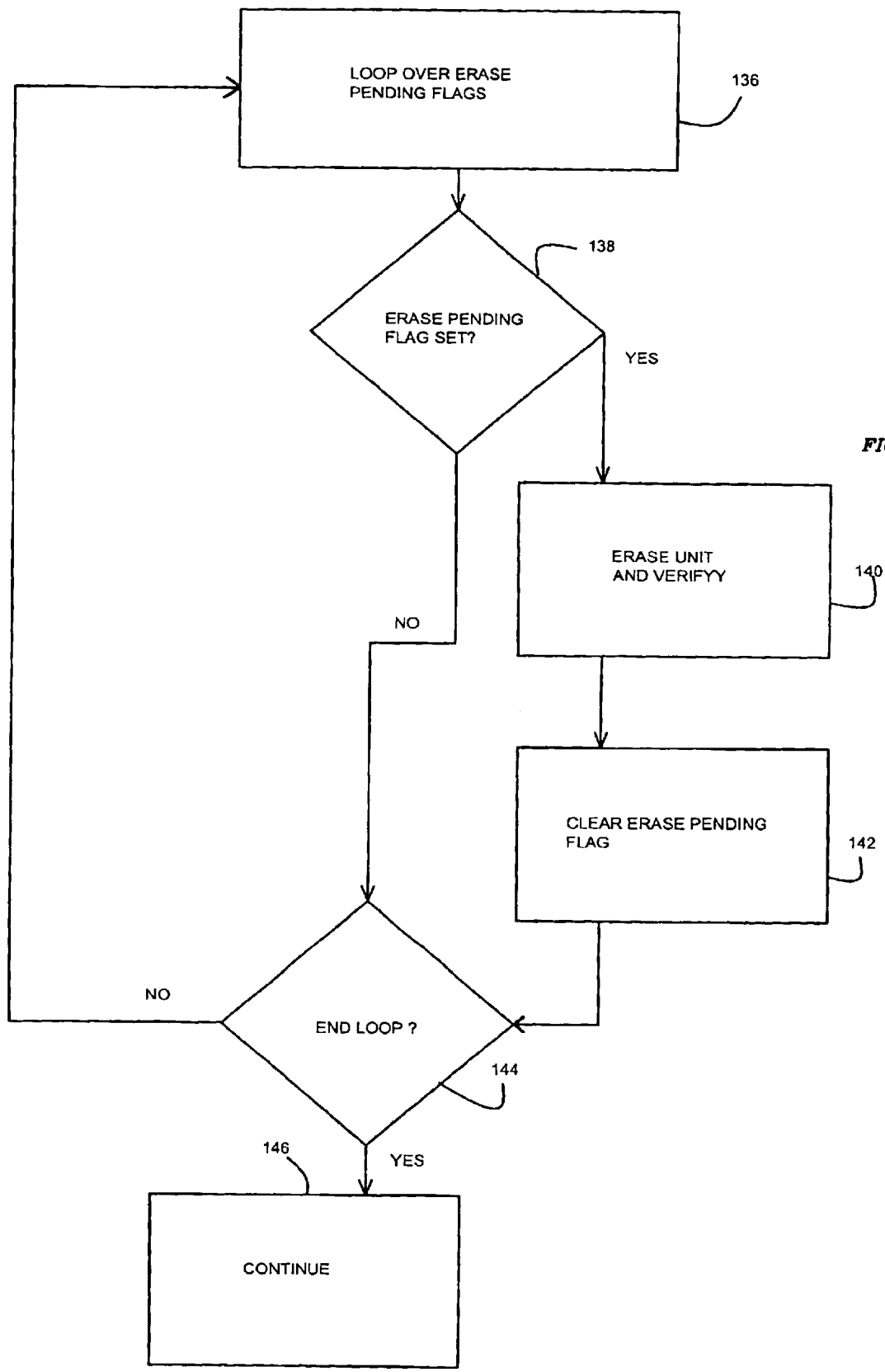
FIG. 7 is a partial flow chart of the power-up procedure of the flash memory device of FIGS. 5 and 11.

Refer now to FIG. 7, which is a partial flow chart of the power-up procedure of flash memory device 30. When flash memory device 30 is powered up, control module 12 checks all three erase pending flags (block 136). If any of the erase pending flags are set (block 138), that indicates that the erasure of the units u, whose unit numbers are stored in the corresponding unit number registers 34, was interrupted by a loss of power. For each of the units whose erasure was interrupted by the loss of power, control module 12 erases the unit and verifies the erasure (block 140). Control module 12 then clears the corresponding erase pending flag (block 142) After all erase pending flags have been checked (block 144), normal operation of flash memory device 30 commences (block 146).

In this embodiment of the present invention, no special precautions need to be taken prior to writing to one of pages p. As in the first embodiment of the present invention, setting, clearing and checking the erase pending flags may be done by the flash device hardware, by the controller firmware, by the flash management software, or by a combination of the three.

Figure 8:
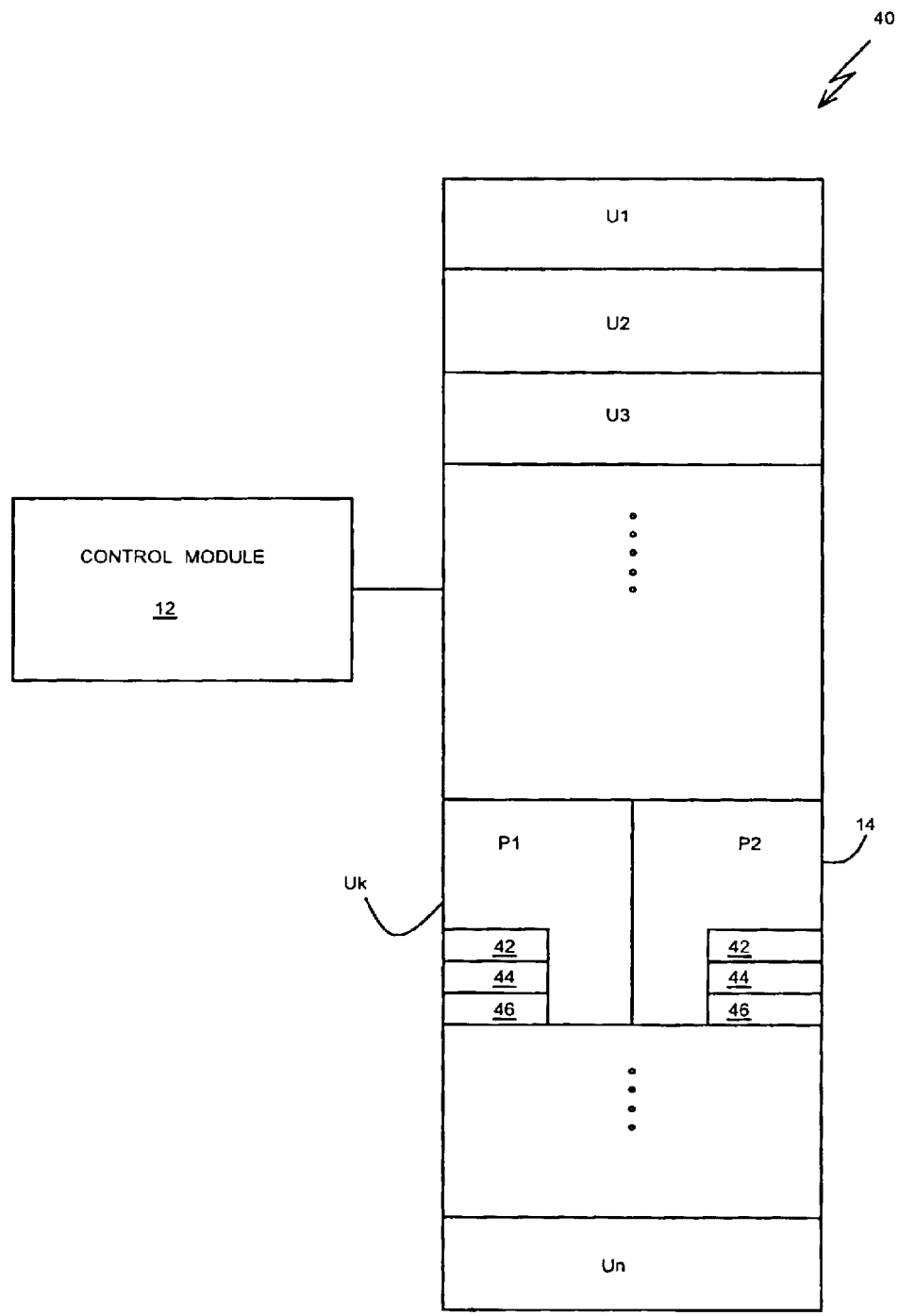
FIG. 8 illustrates a flash memory device of a third embodiment of the present invention.

A third embodiment of the present invention is illustrated in FIG. 8. This embodiment of the present invention operates entirely in software and so is suitable for use with prior art flash memory devices such as flash memory device 10, provided that control module 12 is modified to manage flash memory 14 as described below. Consequently, flash memory device 40 of FIG. 8 is structurally identical to flash memory device 10.

Figure 9:
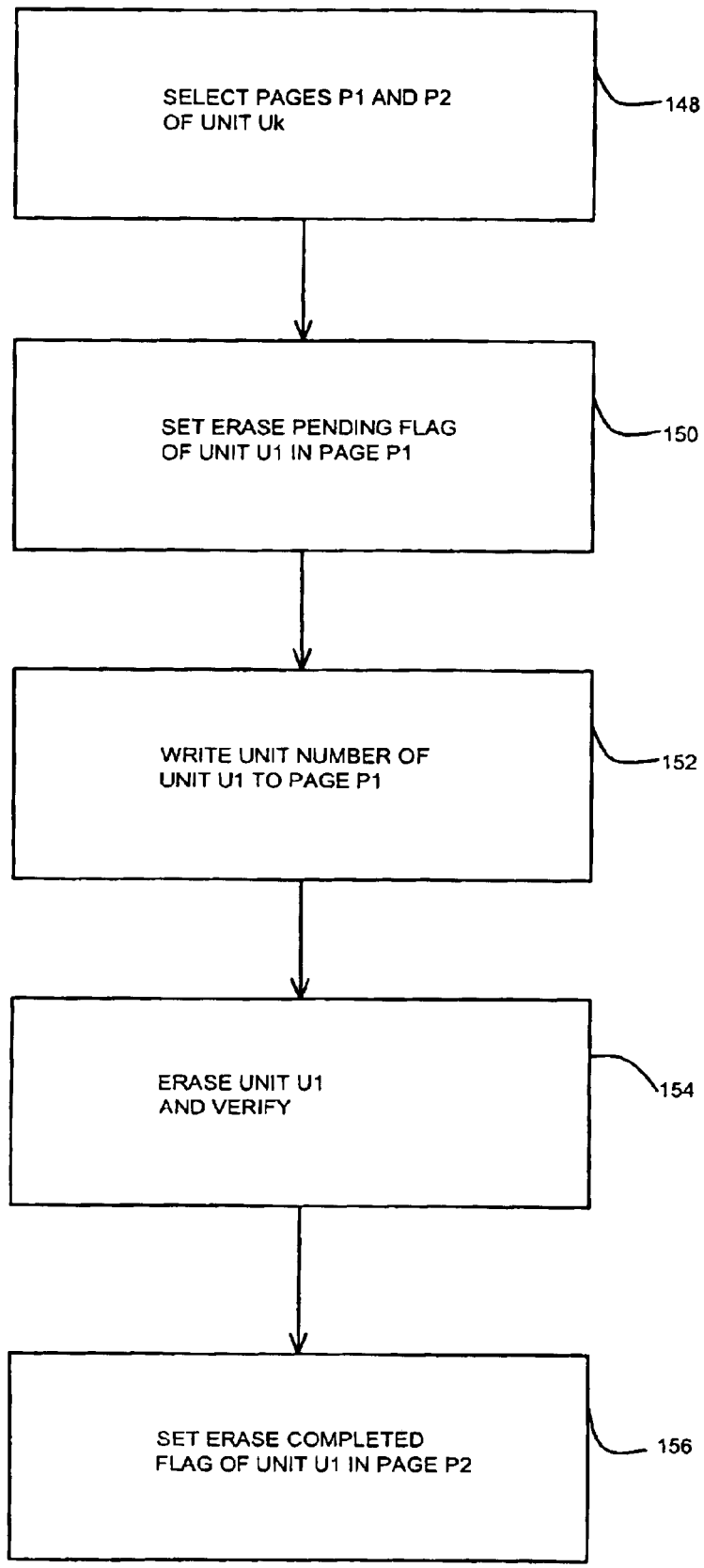
FIG. 9 is a flow chart of all erase operation of the flash memory device of FIG. 8.

According to the third embodiment of the present invention, three addressable locations a of each page p are allocated for managing flash memory 14; an addressable location 42 that is used to store an erase pending flag, an addressable location 44 that is used to store a unit number, and an addressable location 46 that is used to store an erase completed flag. Suppose, for definiteness, that unit u1 is to be erased. Refer now to FIG. 9 which is a flow chart of an erase operation of flash memory device 40. Control module 12 selects two pages p1 and p2, of another unit uk that is available for writing, for managing the erasure of unit u1 (block 148). Before erasing unit u1, control module 12 sets an erase pending flag in addressable location 42 of page p1 of unit uk (block 150) and also writes the unit number of unit u1 to addressable location 44 of page p4 of unit uk (block 152). The steps of blocks 150 and 152 preferably are done together, so as to count as only one write operation and so not violate the PPP restriction. After the erasure of unit u1 has been completed and verified (block 154), control module 12 sets an erase completed flat in addressable location 46 of page p2 of unit uk (block 156). Note that addressable location 42 that is used for the erase pending flag and addressable location 46 that is used for the erase completed flag are in different pages p, to allow for flash memory 14 having a PPP value of 1. If flash memory 14 has a PPP value greater than 1, then addressable location 42 that is used for the erase pending flag and addressable location 46 that is used for the erase completed flag may be in the same page p. Note also that, even in the PPP>1 case, addressable locations 42 and 46 of unit uk should not have been written to since the last time unit uk was erased. This guarantees that the erase completed flag is cleared (i.e., not set) prior to the erasing of unit u1.

Clearly, more than one unit u can be erased concurrently according to this embodiment of the present invention, as long as enough addressable locations 42, 44 and 46 have been allocated to manage the erasure, either three addressable locations a per page p as illustrated, or in multiples of three addressable locations a per page p.

Figure 10:
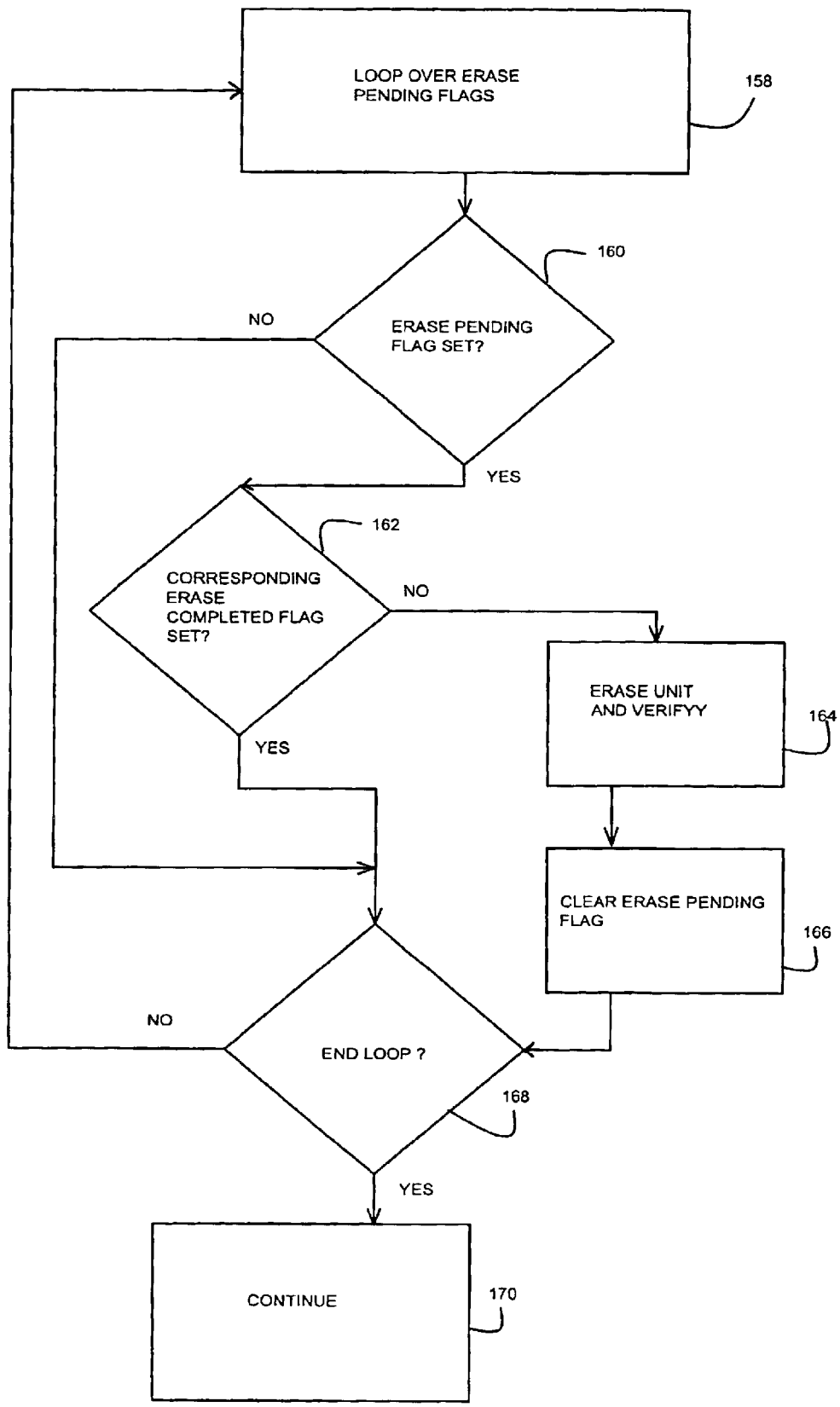
FIG. 10 is a partial flow chart of the power-up procedure of the flash memory device of FIG. 8.

Refer now to FIG. 10, which is a partial flow chart of the power-up procedure of flash memory device 40. When flash memory device 40 is powered up, control module 12 checks all addressable locations 42 and 46 that were potentially allocated for the most recent set of erasures (block 158), to make sure that each set erase pending flag (block 160) is matched by a corresponding set erase completed flag (block 162). For each erase pending flag that is not matched by a corresponding set erase completed flag, control module 12 erases the unit u whose unit number is stored in the corresponding addressable location 44 and verifies the erasure (block 164). Control module 12 then sets the corresponding erase completed flag (block 166). After all erase pending flags have been checked (block 168), normal operation of flash memory device 40 commences (block 170).

As in the second embodiment of the present invention, no special precautions need to be taken prior to writing to one of pages p.

As described above, the first two embodiments set erase pending flags before erasing units u, and clear the erase pending flags after successfully completed erasures; whereas the third embodiment sets erase pending flags before erasing units u and balances the erase pending flags by setting corresponding erase completed flags after successfully completed erasures. It will be appreciated that, alternatively, the first two embodiments also could balance their erase pending flags with corresponding erase completed flags after successfully completed erasures instead of clearing their erase pending flags The first three embodiments of the present invention operate by storing information, such as erase pending flags and unit numbers, before erasing any units u. According to a fourth embodiment of the present invention, such information is stored only when it is really needed: upon detection of a loss of power during an erasure.

Figure 11:
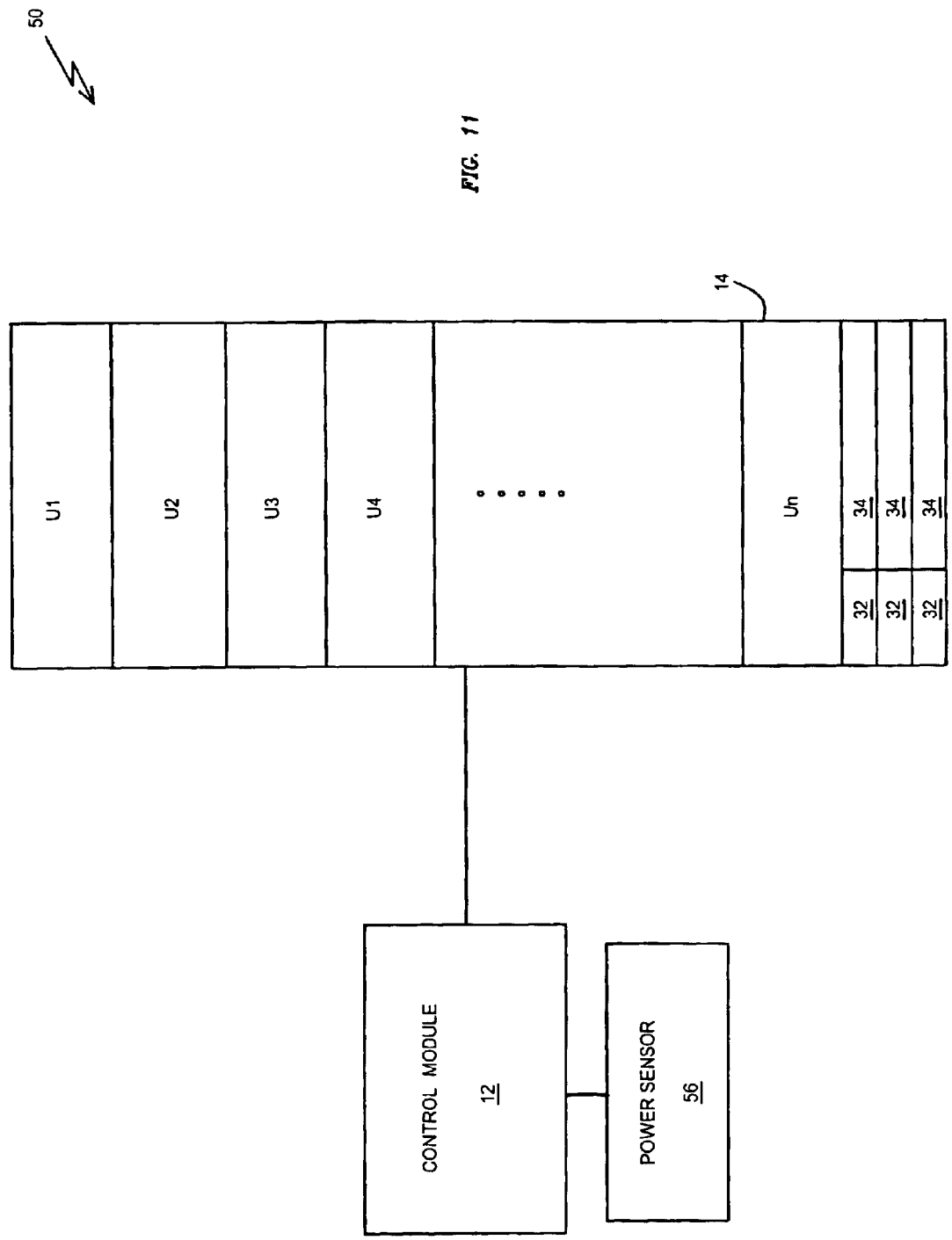
FIG. 11 illustrates a flash memory device of a fourth embodiment of the present invention.

FIG. 11 shows a flash memory device 50 according to the fourth embodiment of the present invention. Flash memory device 50 is identical to flash memory device 30, with the addition of a power sensor 56 for detecting a loss of power and a capacitor array (not shown) to provide enough reserve power for saving information about any units u whose erasure may be interrupted by the loss of power. See, for example, Portman et al., WO 01/22205, which is incorporated by reference for all purposes as if fully set forth herein, for an example of a prior art system that uses a power sensor to detect loss of power from an external power source and an external capacitor array to enable graceful power-down in the event of loss of power from the external power source.

Figure 12:
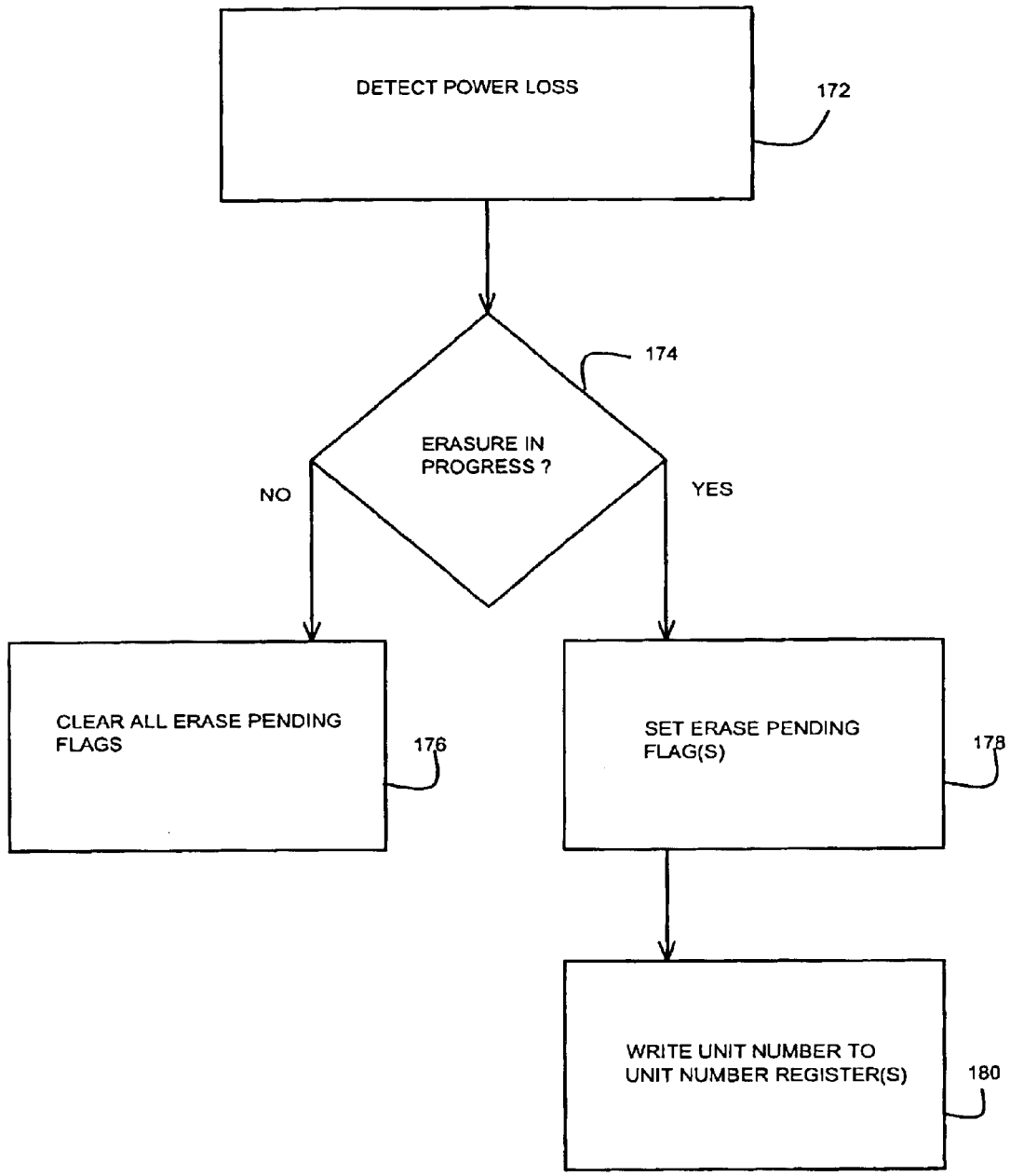
FIG. 12 is a partial flow chart of the power-down procedure of the flash memory device of FIG. 11.

Refer now to FIG. 12, which is a partial flow chart of the power-down procedure of flash memory device 50. When control module 12 detects a loss of power (block 172) during an erasure (block 174), then for each unit u being erased at that time, control module 12 sets an erase pending flag in a corresponding flag register 32 (block 178) and writes the unit number of the unit to a corresponding unit number register 34 (block 180). When flash memory device 50 is powered down normally, control module 12 clears all the erase pending flags to make sure that normal shutdown is not confused with an unexpected loss of power (block 176). A detection of loss of power during an erasure is defined herein to be "synchronous" with the erasure. A detection of loss of power while no erasure is being performed, for example a detection of loss of power during normal shutdown, is defined herein to be "asynchronous" with the erasures.

FIG. 7, in addition to illustrating the power-up procedure of flash memory device 30, also illustrates the power-up procedure of flash memory device 50. When flash memory device 50 is powered up, control module 12 checks all three erase pending flags (block 136) If any of the erase pending flags are set (block 138), that indicates that the erasure of the units u, whose unit numbers are stored in the corresponding unit number registers 34, was interrupted by a loss of power. For each of the units whose erasure was interrupted by the loss of power, control module 12 erases the unit and verities the erasure (block 140). Control unit 12 then clears the corresponding erase pending flag (block 142). After all erase pending flags have been checked (block 144), normal operation of flash memory device 50 commences (block 146).

In this embodiment of the present invention, as in the second and third embodiments, no special precautions need to be taken prior to writing to one of pages p. As in the first and second embodiments of the present invention, checking and then clearing the erase pending flags during power-up may be done by the flash device hardware, by the controller firmware, by the flash management software, or by a combination of the three. However, setting or clearing the erase pending flags upon detecting a power loss is done only by the flash device hardware, by the controller firmware, or by a combination of the two, and not by software, because of the need for rapid response in case of power loss.

While the invention has been described with respect to a limited number of embodiments, it will be appreciated that many variations, modifications and other applications of the invention may be made.

What is claimed is:

1. A method of managing a flash memory that includes a plurality of units, each unit including a plurality of addressable locations, the method comprising the steps of:
 (a) providing each unit with a respective flag register separate from the addressable locations of said each unit;
 (b) prior to erasing at least one of the units, setting a respective erase pending flag in said respective flag register of each said at least one unit that is to be erased; and
 (c) erasing said at least one unit.

2. The method of claim 1, wherein said setting is effected by hardware.

3. The method of claim 1, wherein said setting is effected by firmware.

4. The method of claim 1, wherein said setting is effected by software.

5. The method of claim 1, further comprising the step of:
 (d) subsequent to said erasing of said at least one unit, providing an indication that said at least one unit has been erased.

6. The method of claim 5, wherein said providing of said indication, that said at least one unit has been erased, is effected by steps including: for each said at least one unit that has been erased: clearing said respective erase pending flag in said respective flag register of said each at least one unit.

7. The method of claim 6, wherein said clearing is effected by hardware.

8. The method of claim 6, wherein said clearing is effected by firmware.

9. The method of claim 6, wherein said clearing is effected by software.

10. A method of managing a flash memory that includes a plurality of units, each unit including a plurality of addressable locations, the method comprising the steps of:
 (a) providing each unit with a respective flag register separate from the addressable locations of said each unit;
 (b) prior to erasing at least one of the units, setting a respective erase pending flag in said respective flag register of each said at least one unit that is to be erased;
 (c) erasing said at least one unit; and
 (d) subsequent to said erasing of said at least one unit, providing an indication that said at least one unit has been erased, by steps including: for each said at least one unit that has been erased: clearing said respective erase pending flag in said respective flag register of said each at least one unit;
 (e) prior to writing to one of the units: checking whether said respective erase pending flag of said one unit has been cleared; and
 (f) subsequent to said checking;
  (i) if said respective erase pending flag of said one unit has been cleared: writing to said one unit;
  (ii) otherwise:
   (A) erasing said at least one unit, and
   (B) clearing said respective erase pending flag of said one unit.

11. The method of claim 10, wherein said checking and said erasing subsequent to said checking are effected by hardware.

12. The method of claim 10, wherein said checking and said erasing subsequent to said checking are effected by firmware.

13. The method of claim 10, wherein said checking is effected by software and wherein said subsequent erasing is effected by steps including issuing a software erase command.

14. A method of managing a flash memory that includes a plurality of units, each unit having a respective unit number, each unit including a plurality of addressable locations, the method comprising the steps of:
 (a) providing at least one flag register separate from the addressable locations of the units;
 (b) providing, for each said at least one flag register, a corresponding unit number register separate from the addressable locations of the units;
 (c) prior to erasing at least one of the units: for each said at least one unit that is to be erased;
  (i) setting a respective erase pending flag in one of said at least one flag register, and
  (ii) storing the respective unit number of said each unit in said unit number register that corresponds to said one flag register;
 (d) erasing said at least one unit;
 (e) subsequent to said erasing of said at least one unit, providing an indication that said at least one unit has been erased, by steps including clearing each said at least one erase pending flag; and
 (f) upon powering up the flash memory, if one of said at least one erase pending flag is set, erasing the unit whose respective unit number is stored in said unit number register that corresponds to said one erase pending flag.

15. A method of managing a flash memory that includes a plurality of units, each unit having a respective unit number, each unit including a plurality of addressable locations, the method comprising the steps of:
- (a) providing at least one flag register separate from the addressable locations of the units;
- (b) providing, for each said at least one flag register, a corresponding unit number register separate from the addressable locations of the units;
- (c) prior to erasing at least one of the units: for each said at least one unit that is to be erased:
  - (i) setting a respective erase pending flag in one of said at least one flag register, and
  - (ii) storing the respective unit number of said each unit in said unit number register that corresponds to said one flag register; and
- (d) erasing said at least one unit.

16. The method of claim 15, wherein said setting and said storing are effected by hardware.

17. The method of claim 15, wherein said setting and said storing are effected by firmware.

18. The method of claim 15, wherein said setting and said storing are effected by software.

19. The method of claim 15, further comprising the step of:
- (e) subsequent to said erasing of said at least one unit, providing an indication that said at least one unit has been erased.

20. The method of claim 19, wherein said providing of said indication, that said at least one unit has been erased, is effected by steps including clearing each said at least one erase pending flag.

21. The method of claim 20, wherein said clearing is effected by hardware.

22. The method of claim 20, wherein said clearing is effected by firmware.

23. The method of claim 20, wherein said clearing is effected by software.

24. The method of claim 14, wherein said erasing, of said unit whose respective unit number is stored in said unit number register that corresponds to said one erase pending flag, is effected by hardware.

25. The method of claim 14, wherein said erasing, of said unit whose respective unit number is stored in said unit number register that corresponds to said one erase pending flag, is effected by firmware.

26. The method of claim 14, wherein said erasing, of said unit whose respective unit number is stored in said unit number register that corresponds to said one erase pending flag, is effected by steps including issuing a software erase command.

27. The method of claim 15, wherein said at least one flag register and said at least one unit number register are non-volatile.

28. A method of managing a flash memory that includes a plurality of units, each unit having a respective unit number, each unit including a plurality of addressable locations, the method comprising the steps of:
- (a) allocating at least one erase pending location in the flash memory;
- (b) for each said at least one erase pending location, allocating a corresponding erase completed location in the flash memory separate from said each at least one erase pending location;
- (c) prior to erasing at least one of the units, for each said at least one unit that is to be erased, setting an erase pending flag in a corresponding one of said at least one erase pending locations that is outside said each unit that is to be erased;
- (d) erasing said at least one unit; and
- (e) for each said at least one unit, subsequent to said erasing of said each unit, setting an erase completed flag in a corresponding one of said at least one erase completed location.

29. The method of claim 28, wherein each said at least one erase pending location is an addressable location in the flash memory.

30. The method of claim 28, further comprising the step of:
- (f) for each said at least one unit, prior to said erasing of said each unit, clearing said corresponding erase completed flag.

31. The method of claim 28, further comprising the step of:
- (f) upon powering up the flash memory, if one of said at least one erase pending flag is set and said erase completed flag that corresponds to said one erase pending flag is cleared, erasing the unit that corresponds to said one erase pending flag.

32. The method of claim 28, further comprising the steps of:
- (f) for each said at least one erase pending location, allocating a corresponding unit number storage location; and
- (g) prior to erasing at least one of the units, for each said at least one unit that is to be erased, storing the unit number of said each unit in said unit number storage location that corresponds to said erase pending location wherein said erase pending flag of said each unit is set.

33. A method of managing a flash memory that includes a plurality of units, each unit having a respective unit number, each unit including a plurality of addressable locations, the method comprising the steps of:
- (a) allocating at least one erase pending location in the flash memory;
- (b) for each said at least one erase pending location, allocating a corresponding unit number storage location in the flash memory separate from said each at least one erase pending location;
- (c) prior to erasing at least one of the units, for each said at least one unit that is to be erased:
  - (i) setting an erase pending flag in a corresponding one of said at least one erase pending location that is outside said each unit that is to be erased, and
  - (ii) storing the unit number of said each unit in said unit number storage location that corresponds to said corresponding one erase pending location; and
- (d) erasing said at least one unit.

34. The method of claim 33, wherein each said at least one erase pending location is an addressable location in the flash memory.

35. The method of claim 33, further comprising the steps of:
- (e) for each said at least one erase pending location, allocating a corresponding erase completed location in the flash memory separate from said each at least one erase pending location;
- (f) subsequent to erasing at least one of the units, for each said at least one unit that has been erased, setting an erase completed flag in a corresponding one of said at least one erase completed location; and
- (g) upon powering up the flash memory: if one of said at least one erase pending flag is set and said erase completed flag that corresponds to said one erase pending flag is cleared, erasing the unit that corresponds to said one erase pending flag.

36. The method of claim 35, further comprising the step of:
(h) prior to erasing at least one of the units, for each said at least one unit that is to be erased, clearing said erase completed flag in said corresponding erase completed location.

37. A method of managing a flash memory that includes a plurality of units, each unit including a plurality of addressable locations, the method comprising the steps of:
(a) providing at least one flag register separate from the addressable locations of the units;
(b) prior to erasing at least one of the units, setting a respective erase pending flag in one of said at least one flag register; and
(c) erasing said at least one unit.

38. The method of claim 37, wherein said setting is effected by hardware.

39. The method of claim 37, wherein said setting is effected by firmware.

40. The method of claim 37, wherein said setting is effected by software.

41. The method of claim 37, further comprising the step of:
(d) subsequent to said erasing of said at least one unit, providing an indication that said at least one unit has been erased.

42. The method of claim 41, wherein said providing is effected by steps including clearing each said erase pending flag.

43. The method of claim 37, wherein said at least one flag register is non-volatile.

44. A method of managing a flash memory that includes a plurality of units, each unit having a respective unit number, each unit including a plurality of addressable locations, the flash memory being operative to erase at most a certain maximum number of the units substantially concurrently, the method comprising the steps of:
(a) providing flag registers equal in number to said maximum number of units;
(b) for each said flag register, providing a corresponding unit number register;
(c) erasing at least one of the units;
(d) detecting a power loss by the flash memory; and
(e) if said power loss is synchronous with said erasing: for each said at least one unit that is being erased:
(i) setting a respective erase pending flag in a corresponding said flag register, and
(ii) storing the respective unit number of said each unit in said unit number register that corresponds to said corresponding flag register.

45. The method of claim 44, further comprising the step of:
(f) if said power loss is asynchronous with said erasing: clearing all said erase pending flags.

46. The method of claim 44, wherein said flag registers and said unit number registers are separate from the addressable locations of the units.

47. The method of claim 44, further comprising the step of:
(f) upon powering up the flash memory: for each said flag register wherein said respective erase pending flag is set: erasing said unit whose unit number is stored in said corresponding unit number register.

48. The method of claim 47, wherein said erasing, of said unit whose unit number is stored in said corresponding unit number register, is effected by hardware.

49. The method of claim 47, wherein said erasing, of said unit whose unit number is stored in said corresponding unit number register, is effected by firmware.

50. The method of claim 47, wherein said erasing, of said unit whose unit number is stored in said corresponding unit number register, is effected by steps including issuing a software erase command.

51. The method of claim 44, wherein said setting and said storing are effected by hardware.

52. The method of claim 44, wherein said setting and said storing are effected by firmware.

53. The method of claim 44, wherein said flag registers and said unit number registers are non-volatile.

54. A flash memory device comprising:
(a) a plurality of units, each unit including a plurality of addressable locations; and
(b) for each said unit, a respective flag register, separate from said addressable locations of said each unit, for indicating that said each unit is designated to be erased.

55. The flash memory device of claim 54, further comprising:
(c) a mechanism for setting an erase pending flag in said respective flag register of each said unit that is designated to be erased and for clearing said erase pending flag subsequent to said erasure.

56. The flash memory device of claim 55, wherein said mechanism is implemented in hardware.

57. The flash memory device of claim 55, wherein said mechanism is implemented in firmware.

58. The flash memory device of claim 54, further comprising:
(c) a mechanism for enabling an external device to set an erase pending flag in said respective flag register of each said unit that is designated to be erased and to clear said erase pending flag subsequent to said erasure.

59. The flash memory device of claim 58, wherein said setting of said erase pending flags and said clearing of said erase pending flags are effected by firmware of said external device.

60. The flash memory device of claim 58, wherein said setting of said erase pending flags and said clearing of said erase pending flags are effected by software of said external device.

61. The flash memory device of claim 54, wherein said flag registers are non-volatile.

62. A flash memory device comprising:
(a) a plurality of units, each unit having a respective unit number, each unit including a plurality of addressable locations;
(b) at least one flag register, separate from said addressable locations, for storing an erase pending flag that indicates that one of said units is designated to be erased; and
(c) for each said at least one flag register, a corresponding unit number register, separate from said addressable locations, for storing said unit number of said one unit.

63. The flash memory device of claim 62, further comprising:
(d) a mechanism for, for each said unit that is to be erased:
(i) setting a respective erase pending flag in one of said at least one flag register,
(ii) storing said unit number of said each unit in said unit number register that corresponds to said one flag register, and (iii) clearing said respective erase pending flag subsequent to said erasure.

64. The flash memory device of claim 63, wherein said mechanism is implemented in hardware.

65. The flash memory device of claim 63, wherein said mechanism is implemented in firmware.

66. The flash memory device of claim 62, further comprising:
   (d) a mechanism for, for each said unit that is to be erased, enabling an external device to:
      (i) set a respective erase pending flag in one of said at least one flag register,
      (ii) store said unit number of said each unit in said unit number register that corresponds to said one flag register, and
      (iii) clear said respective erase pending flag subsequent to said erasure.

67. The flash memory device of claim 66, wherein said setting, said storing and said clearing are effected by firmware of said external device.

68. The flash memory device of claim 66, wherein said setting, said storing and said clearing are effected by software of said external device.

69. The flash memory device of claim 62, wherein said at least one flag register and said at least one unit number register are non-volatile.

70. A flash memory device comprising:
   (a) a plurality of units, each unit having a respective unit number, each unit including a plurality of addressable locations;
   (b) a detecting mechanism for detecting a power loss; and
   (c) a recording mechanism for recording said unit numbers of said units that are being erased when said detecting mechanism detects said power loss.

71. The flash memory device of claim 70, wherein said recording mechanism includes:
   (i) flag registers, equal in number to a maximum number of said units that can be erased substantially concurrently, for storing erase pending flags, wherein each said pending flag, when set, indicates that one of said units is being erased when said detecting mechanism detects said power loss; and
   (ii) for each said flag register, a corresponding unit number register for storing the unit number of said one unit.

72. The flash memory device of claim 71, wherein said flag registers and said unit number registers are separate from said addressable locations.

73. The flash memory device of claim 72, further comprising:
   (d) an initialization mechanism for identifying and erasing said units, whose unit numbers have been recorded by said recording mechanism, when the flash memory device is powered up.

74. The flash memory device of claim 73, wherein said initialization mechanism is implemented in hardware.

75. The flash memory device of claim 73, wherein said initialization mechanism is implemented in firmware.

76. The flash memory device of claim 73, wherein said initialization mechanism enables said identifying by software.

77. The flash memory device of claim 70, wherein said recording mechanism is implemented in hardware.

78. The flash memory device of claim 70, wherein said recording mechanism is implemented in firmware.

79. The method of claim 28, wherein, for each unit that is erased, said corresponding erase completed location is outside of said each unit.

80. The method of claim 29, wherein each said at least one erase completed location is an addressable location in the flash memory.

81. The method of claim 33, wherein, for each unit that is erased, said corresponding unit number storage location is outside of said each unit.

82. The method of claim 34, wherein each said at least one unit number storage location is an addressable location in the flash memory.

* * * * *

UNITED STATES PATENT AND TRADEMARK OFFICE
CERTIFICATE OF CORRECTION

PATENT NO. : 6,977,847 B2 Page 1 of 1
DATED : December 20, 2005
INVENTOR(S) : Menahem Lasser and Meir Avraham It is certified that error appears in the above-identified patent and that said Letters Patent is hereby corrected as shown below:

<u>Column 12,</u>
Between lines 38 and 40, insert the following:
14. The method of claim 1, wherein said flag registers are nonvolatile.

Signed and Sealed this

Second Day of May, 2006

JON W. DUDAS
*Director of the United States Patent and Trademark Office*